(12) United States Patent
Ullmann et al.

(10) Patent No.: US 8,315,061 B2
(45) Date of Patent: Nov. 20, 2012

(54) ELECTRONIC CIRCUIT WITH ELONGATED STRIP LAYER AND METHOD FOR THE MANUFACTURE OF THE SAME

(75) Inventors: Andreas Ullmann, Zirndorf (DE); Alexander Knobloch, Erlangen (DE); Merlin Welker, Baiersdorf (DE); Walter Fix, Nuremberg (DE)

(73) Assignee: PolyIC GmbH & Co. KG, Furth (DE)

( * ) Notice: Subject to any disclaimer, the term of this patent is extended or adjusted under 35 U.S.C. 154(b) by 789 days.

(21) Appl. No.: 11/991,887

(22) PCT Filed: Sep. 13, 2006

(86) PCT No.: PCT/EP2006/008930
§ 371 (c)(1),
(2), (4) Date: Apr. 10, 2008

(87) PCT Pub. No.: WO2007/031303
PCT Pub. Date: Mar. 22, 2007

(65) Prior Publication Data
US 2010/0214748 A1    Aug. 26, 2010
US 2012/0057311 A9    Mar. 8, 2012

(30) Foreign Application Priority Data
Sep. 16, 2005   (DE) .......................... 10 2005 044 306

(51) Int. Cl.
H05K 1/00        (2006.01)
H05K 1/03        (2006.01)

(52) U.S. Cl. ......... 361/749; 361/750; 174/254; 174/256

(58) Field of Classification Search .................. 361/748, 361/749, 750, 792, 795; 174/250, 254
See application file for complete search history.

(56) References Cited

U.S. PATENT DOCUMENTS

| | | |
|---|---|---|
| 3,512,052 A | 12/1970 | MacIver et al. |
| 3,769,096 A | 10/1973 | Ashkin |
| 3,955,098 A | 5/1976 | Kawamoto |
| 3,999,122 A | 12/1976 | Winstel et al. |
| 4,246,298 A | 1/1981 | Guarnery |
| 4,302,648 A | 11/1981 | Sado et al. |

(Continued)

FOREIGN PATENT DOCUMENTS
AU         488652         4/1976
(Continued)

OTHER PUBLICATIONS
Office Action in German priority application dated Jun. 9, 2006.
(Continued)

*Primary Examiner* — Timothy Thompson
*Assistant Examiner* — Nathan Milakovich
(74) *Attorney, Agent, or Firm* — Carella, Byrne, et al.; Elliot M. Olstein; William Squire (57) ABSTRACT

The invention relates to an electronic circuit and to a method for the manufacture of an electronic circuit comprising at least two electronic components on a common flexible substrate, wherein the at least two electronic components in each case have at least one electrical functional layer composed of identical functional layer material. The electrical functional layers are formed from identical functional layer material and from layer regions of a layer formed in strip-type fashion on the substrate.

37 Claims, 8 Drawing Sheets

U.S. PATENT DOCUMENTS

| | | | |
|---|---|---|---|
| 4,340,057 A | 7/1982 | Bloch | |
| 4,442,019 A | 4/1984 | Marks | |
| 4,472,627 A | 9/1984 | Weinberger | |
| 4,554,229 A | 11/1985 | Small | |
| 4,587,719 A * | 5/1986 | Barth | 438/113 |
| 4,865,197 A | 9/1989 | Craig | |
| 4,926,052 A | 5/1990 | Hatayama | |
| 4,937,119 A | 6/1990 | Nikles et al. | |
| 5,053,679 A | 10/1991 | Thioulouse | |
| 5,075,816 A | 12/1991 | Stormbom | |
| 5,173,835 A | 12/1992 | Cornett et al. | |
| 5,202,677 A | 4/1993 | Parker et al. | |
| 5,206,525 A | 4/1993 | Yamamoto et al. | |
| 5,213,983 A * | 5/1993 | Gustafsson et al. | 438/82 |
| 5,259,926 A | 11/1993 | Kuwabara et al. | |
| 5,321,240 A | 6/1994 | Takahira | |
| 5,347,144 A | 9/1994 | Garnier et al. | |
| 5,364,735 A | 11/1994 | Akamatsu | |
| 5,395,504 A | 3/1995 | Hoffman et al. | |
| 5,480,839 A | 1/1996 | Ezawa et al. | |
| 5,486,851 A | 1/1996 | Gehner et al. | |
| 5,502,396 A | 3/1996 | Desarzens | |
| 5,528,222 A | 6/1996 | Moskowitz | |
| 5,546,889 A | 8/1996 | Wakita et al. | |
| 5,569,879 A | 10/1996 | Gloton et al. | |
| 5,574,291 A | 11/1996 | Dodabalapur et al. | |
| 5,578,513 A | 11/1996 | Maegawa | |
| 5,580,794 A | 12/1996 | Allen | |
| 5,625,199 A | 4/1997 | Baumbach et al. | |
| 5,625,474 A | 4/1997 | Aomori et al. | |
| 5,629,530 A | 5/1997 | Brown et al. | |
| 5,630,986 A | 5/1997 | Charlton | |
| 5,652,645 A | 7/1997 | Jain | |
| 5,691,089 A | 11/1997 | Smayling | |
| 5,693,956 A | 12/1997 | Shi | |
| 5,705,826 A | 1/1998 | Aratani et al. | |
| 5,707,894 A | 1/1998 | Hsiao | |
| 5,729,428 A | 3/1998 | Sakata et al. | |
| 5,763,058 A * | 6/1998 | Isen et al. | 428/209 |
| 5,854,139 A | 12/1998 | Kondo et al. | |
| 5,869,972 A | 2/1999 | Birch et al. | |
| 5,883,397 A | 3/1999 | Isoda et al. | |
| 5,892,244 A | 4/1999 | Tanaka et al. | |
| 5,946,551 A | 8/1999 | Dimitrakopoulos | |
| 5,967,048 A | 10/1999 | Fromson et al. | |
| 5,970,318 A | 10/1999 | Choi et al. | |
| 5,973,598 A | 10/1999 | Beigel | |
| 5,994,773 A | 11/1999 | Hirakawa | |
| 5,997,817 A | 12/1999 | Crismore et al. | |
| 5,998,805 A | 12/1999 | Shi et al. | |
| 6,021,050 A * | 2/2000 | Ehman et al. | 361/793 |
| 6,036,919 A | 3/2000 | Thym et al. | |
| 6,045,977 A | 4/2000 | Chandross et al. | |
| 6,060,338 A | 5/2000 | Tanaka et al. | |
| 6,072,716 A | 6/2000 | Jacobson et al. | |
| 6,083,104 A | 7/2000 | Choi | |
| 6,087,196 A | 7/2000 | Sturm et al. | |
| 6,107,920 A | 8/2000 | Eberhardt et al. | |
| 6,133,835 A | 10/2000 | DeLeeuw et al. | |
| 6,137,687 A * | 10/2000 | Shirai et al. | 361/749 |
| 6,150,668 A | 11/2000 | Bao | |
| 6,180,956 B1 | 1/2001 | Chondroudis | |
| 6,197,663 B1 | 3/2001 | Chandross | |
| 6,207,472 B1 | 3/2001 | Callegari et al. | |
| 6,215,130 B1 | 4/2001 | Dodabalapur | |
| 6,221,553 B1 | 4/2001 | Wolk | |
| 6,251,513 B1 | 6/2001 | Rector | |
| 6,259,506 B1 | 7/2001 | Lawandy | |
| 6,284,562 B1 | 9/2001 | Batlogg et al. | |
| 6,291,126 B2 | 9/2001 | Wolk et al. | |
| 6,300,141 B1 | 10/2001 | Segal et al. | |
| 6,321,571 B1 | 11/2001 | Themont et al. | |
| 6,322,736 B1 | 11/2001 | Bao | |
| 6,326,288 B1 | 12/2001 | Bornefeld | |
| 6,329,226 B1 | 12/2001 | Jones | |
| 6,330,464 B1 | 12/2001 | Colvin | |
| 6,335,539 B1 | 1/2002 | Dimitrakopoulos et al. | |
| 6,336,017 B1 | 1/2002 | Miyamoto et al. | |
| 6,340,822 B1 | 1/2002 | Brown et al. | |
| 6,344,662 B1 | 2/2002 | Dimitrakopoulos et al. | |
| 6,362,509 B1 | 3/2002 | Hart | |
| 6,369,793 B1 | 4/2002 | Parker | |
| 6,384,804 B1 | 5/2002 | Dodabalapur et al. | |
| 6,403,396 B1 | 6/2002 | Gudesen et al. | |
| 6,414,728 B1 | 7/2002 | Faris et al. | |
| 6,420,200 B1 * | 7/2002 | Yamazaki et al. | 438/30 |
| 6,429,450 B1 | 8/2002 | Mutsaers et al. | |
| 6,483,473 B1 | 11/2002 | King et al. | |
| 6,498,114 B1 | 12/2002 | Amundson et al. | |
| 6,517,995 B1 | 2/2003 | Jacobson et al. | |
| 6,518,949 B2 | 2/2003 | Drazic | |
| 6,521,109 B1 | 2/2003 | Bartic et al. | |
| 6,528,816 B1 | 3/2003 | Jackson et al. | |
| 6,541,130 B2 | 4/2003 | Fukuda | |
| 6,548,875 B2 | 4/2003 | Nishiyama | |
| 6,555,840 B1 | 4/2003 | Hudson | |
| 6,566,153 B1 * | 5/2003 | Yang | 438/29 |
| 6,566,156 B1 | 5/2003 | Sturm et al. | |
| 6,593,690 B1 | 7/2003 | McCormick | |
| 6,596,569 B1 | 7/2003 | Bao et al. | |
| 6,603,139 B1 | 8/2003 | Tessler | |
| 6,621,098 B1 | 9/2003 | Jackson | |
| 6,686,693 B1 | 2/2004 | Ogawa | |
| 6,699,728 B2 | 3/2004 | Guenther et al. | |
| 6,736,985 B1 | 5/2004 | Bao et al. | |
| 6,852,583 B2 | 2/2005 | Bernds et al. | |
| 6,859,093 B1 | 2/2005 | Beigel | |
| 6,869,484 B2 * | 3/2005 | Hunt et al. | 118/718 |
| 6,903,958 B2 | 6/2005 | Bernds et al. | |
| 6,960,489 B2 | 11/2005 | Bernds et al. | |
| 6,964,884 B1 * | 11/2005 | Chan et al. | 438/118 |
| 7,032,828 B2 * | 4/2006 | Krul et al. | 235/492 |
| 7,064,345 B2 * | 6/2006 | Fix et al. | 257/40 |
| 7,098,061 B2 * | 8/2006 | Sirringhaus et al. | 438/30 |
| 7,105,915 B1 * | 9/2006 | Finn et al. | 257/666 |
| 7,190,592 B2 * | 3/2007 | Hu | 361/763 |
| 7,223,995 B2 | 5/2007 | Fix et al. | |
| 7,229,868 B2 | 6/2007 | Bernds et al. | |
| 7,238,961 B2 * | 7/2007 | Bernds et al. | 257/40 |
| 7,298,023 B2 | 11/2007 | Guillet et al. | |
| 7,399,656 B2 * | 7/2008 | Zhang et al. | 438/99 |
| 7,442,954 B2 * | 10/2008 | Clemens et al. | 257/40 |
| 7,483,275 B2 * | 1/2009 | Clemens et al. | 361/760 |
| 7,773,386 B2 * | 8/2010 | Yamashita et al. | 361/749 |
| 2001/0006846 A1 | 7/2001 | Cao et al. | |
| 2001/0026187 A1 | 10/2001 | Oku | |
| 2001/0046081 A1 | 11/2001 | Hayashi et al. | |
| 2001/0048341 A1 | 12/2001 | Chakravarthy | |
| 2002/0018911 A1 | 2/2002 | Bernius et al. | |
| 2002/0022284 A1 | 2/2002 | Heeger | |
| 2002/0025391 A1 | 2/2002 | Angelopoulos | |
| 2002/0053320 A1 | 5/2002 | Duthaler | |
| 2002/0056839 A1 | 5/2002 | Joo et al. | |
| 2002/0068392 A1 | 6/2002 | Lee et al. | |
| 2002/0130042 A1 | 9/2002 | Moerman et al. | |
| 2002/0170897 A1 | 11/2002 | Hall | |
| 2002/0195644 A1 | 12/2002 | Dodabalapur et al. | |
| 2003/0059987 A1 | 3/2003 | Sirringhaus et al. | |
| 2003/0060038 A1 * | 3/2003 | Sirringhaus et al. | 438/637 |
| 2003/0070500 A1 | 4/2003 | Hung | |
| 2003/0112576 A1 | 6/2003 | Brewer et al. | |
| 2003/0141807 A1 | 7/2003 | Kawase | |
| 2003/0178620 A1 | 9/2003 | Bernds et al. | |
| 2003/0227664 A1 | 12/2003 | Agrawal et al. | |
| 2004/0002176 A1 | 1/2004 | Xu | |
| 2004/0013982 A1 | 1/2004 | Jacobson et al. | |
| 2004/0026689 A1 | 2/2004 | Bernds et al. | |
| 2004/0029310 A1 | 2/2004 | Bernds et al. | |
| 2004/0063267 A1 | 4/2004 | Bernds et al. | |
| 2004/0084670 A1 | 5/2004 | Tripsas et al. | |
| 2004/0092196 A1 | 5/2004 | Van De Witte et al. | |
| 2004/0119504 A1 | 6/2004 | Baude et al. | |
| 2004/0129978 A1 * | 7/2004 | Hirai | 257/347 |
| 2004/0160389 A1 | 8/2004 | Suyama et al. | |
| 2004/0209191 A1 * | 10/2004 | Bernds et al. | 430/311 |
| 2004/0211329 A1 | 10/2004 | Funahata et al. | |
| 2004/0233065 A1 | 11/2004 | Freeman | |

| | | | | | | |
|---|---|---|---|---|---|---|
| 2004/0239586 | A1 | 12/2004 | Cok | EP | 0 603 939 A2 | 6/1994 |
| 2004/0246413 | A1 | 12/2004 | Stephenson et al. | EP | 0 615 256 | 9/1994 |
| 2004/0256467 | A1 | 12/2004 | Clemens et al. | EP | 0 685 985 | 12/1995 |
| 2004/0266207 | A1* | 12/2004 | Sirringhauss et al. ........ 438/725 | EP | 0 716 458 A2 | 6/1996 |
| 2005/0062066 | A1 | 3/2005 | Bao et al. | EP | 0 716 458 A3 | 6/1996 |
| 2005/0071969 | A1* | 4/2005 | Sirringhaus et al. ........... 29/4.51 | EP | 0 785 578 A2 | 7/1997 |
| 2005/0098775 | A1 | 5/2005 | Kondo | EP | 0 785 578 A3 | 7/1997 |
| 2005/0127357 | A1 | 6/2005 | Wong et al. | EP | 0 786 820 | 7/1997 |
| 2005/0168340 | A1 | 8/2005 | Mosher et al. | EP | 0 690 457 | 12/1999 |
| 2006/0063351 | A1* | 3/2006 | Jain ................ 438/455 | EP | 0 962 984 A2 | 12/1999 |
| 2006/0118779 | A1* | 6/2006 | Clemens et al. ................. 257/40 | EP | 0 962 984 A3 | 12/1999 |
| 2006/0286699 | A1* | 12/2006 | Chae et al. ...................... 438/30 | EP | 0 964 516 B1 | 12/1999 |
| 2008/0200030 | A1* | 8/2008 | Knobloch et al. ............ 438/678 | EP | 0 966 182 | 12/1999 |
| 2009/0108253 | A1* | 4/2009 | Ullmann et al. ................. 257/40 | EP | 0 979 715 | 2/2000 |
| 2010/0033213 | A1* | 2/2010 | Ullmann et al. ............... 326/112 | EP | 0 981 165 | 2/2000 |

FOREIGN PATENT DOCUMENTS

| | | |
|---|---|---|
| EP | 0 989 614 A2 | 3/2000 |
| EP | 1 052 594 | 11/2000 |
| EP | 1 065 725 A2 | 1/2001 |
| EP | 1 065 725 A3 | 1/2001 |
| EP | 1 083 775 | 3/2001 |
| EP | 1 102 335 A2 | 5/2001 |
| EP | 1 103 916 | 5/2001 |
| EP | 1 104 035 A2 | 5/2001 |
| EP | 1 113 502 | 7/2001 |
| EP | 1 134 694 | 9/2001 |
| EP | 1 170 851 | 1/2002 |
| EP | 1 215 725 | 6/2002 |
| EP | 1 224 999 | 7/2002 |
| EP | 1 237 207 | 9/2002 |
| EP | 1 251 720 | 10/2002 |
| EP | 1 296 280 | 3/2003 |
| EP | 1 318 084 | 6/2003 |
| EP | 1 383 179 | 1/2004 |
| EP | 1 401 245 | 3/2004 |
| EP | 1 434 281 | 6/2004 |
| FR | 2793089 | 11/2000 |
| GB | 723598 | 2/1955 |
| GB | 2 058 462 | 4/1981 |
| JP | 54069392 | 6/1979 |
| JP | 60117769 | 6/1985 |
| JP | 61001060 | 1/1986 |
| JP | 62065472 A | 3/1987 |
| JP | 362065477 A | 3/1987 |
| JP | 63205943 | 8/1988 |
| JP | 01169942 | 7/1989 |
| JP | 2969184 | 12/1991 |
| JP | 03290976 A | 12/1991 |
| JP | 05152560 | 6/1993 |
| JP | 05259434 | 10/1993 |
| JP | 05347422 | 12/1993 |
| JP | 06-196724 | 7/1994 |
| JP | 08197788 | 8/1995 |
| JP | 09083040 | 3/1997 |
| JP | 09320760 | 12/1997 |
| JP | 10026934 | 1/1998 |
| JP | 11-040708 | 2/1999 |
| JP | 2000-029403 | 1/2000 |
| JP | 2000-173770 | 6/2000 |
| JP | 2001-085272 | 3/2001 |
| JP | 2001-147659 | 5/2001 |
| JP | 2001-267578 | 9/2001 |
| WO | WO 93/16491 | 8/1993 |
| WO | WO 94/17556 | 8/1994 |
| WO | WO 95/06240 | 3/1995 |
| WO | WO 95/31831 | 11/1995 |
| WO | WO 96/02924 | 2/1996 |
| WO | WO 96/19792 | 6/1996 |
| WO | WO 97/12349 | 4/1997 |
| WO | WO 97/18944 | 5/1997 |
| WO | WO 98/18156 | 4/1998 |
| WO | WO 98/18186 | 4/1998 |
| WO | WO 98/40930 | 9/1998 |
| WO | WO 99/07189 | 2/1999 |
| WO | WO 99/10769 | 3/1999 |
| WO | WO 99/10929 | 3/1999 |
| WO | WO 99/10939 | 3/1999 |
| WO | WO 99/21233 | 4/1999 |
| WO | WO 99/30432 | 6/1999 |
| WO | WO 99/39373 | 8/1999 |

| | | |
|---|---|---|
| DE | 2102735 | 8/1972 |
| DE | 33 38 597 | 5/1985 |
| DE | 37 05 109 | 8/1987 |
| DE | 41 03 675 | 8/1992 |
| DE | 692 32 740 T2 | 4/1993 |
| DE | 42 43 832 | 6/1994 |
| DE | 43 12 766 | 10/1994 |
| DE | 196 29 291 | 1/1997 |
| DE | 196 48 937 | 5/1997 |
| DE | 196 10 284 | 8/1997 |
| DE | 195 06 907 | 9/1998 |
| DE | 198 52 312 | 5/1999 |
| DE | 198 16 860 | 11/1999 |
| DE | 199 18 193 | 11/1999 |
| DE | 198 51 703 | 5/2000 |
| DE | 100 06 257 | 9/2000 |
| DE | 199 20 593 | 11/2000 |
| DE | 199 21 024 | 11/2000 |
| DE | 199 33 757 | 1/2001 |
| DE | 695 19 782 | 1/2001 |
| DE | 199 35 527 | 2/2001 |
| DE | 199 37 262 | 3/2001 |
| DE | 100 12 204 | 9/2001 |
| DE | 100 33 112 | 1/2002 |
| DE | 201 11 825 | 2/2002 |
| DE | 100 43 204 | 4/2002 |
| DE | 100 45 192 | 4/2002 |
| DE | 100 47 171 | 4/2002 |
| DE | 100 58 559 | 5/2002 |
| DE | 100 61 297 | 6/2002 |
| DE | 101 17 663 | 10/2002 |
| DE | 101 20 687 | 10/2002 |
| DE | 101 20 686 | 11/2002 |
| DE | 101 26 859 | 12/2002 |
| DE | 101 26 860 | 12/2002 |
| DE | 101 51 440 | 2/2003 |
| DE | 101 41 440 | 3/2003 |
| DE | 101 53 656 | 5/2003 |
| DE | 101 63 267 | 7/2003 |
| DE | 102 09 400 | 10/2003 |
| DE | 102 19 905 | 12/2003 |
| DE | 102 29 168 | 1/2004 |
| DE | 699 13 745 | 10/2004 |
| DE | 103 30 064 | 12/2004 |
| DE | 103 30 063 | 2/2005 |
| DE | 103 35 336 | 3/2005 |
| DE | 103 38 277 | 3/2005 |
| DE | 103 40 641 | 4/2005 |
| EP | 0 108 650 | 5/1984 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 418 504 | 3/1991 |
| EP | 0 435 029 | 7/1991 |
| EP | 0 442 123 | 8/1991 |
| EP | 0 460 242 | 12/1991 |
| EP | 0 501 456 A2 | 9/1992 |
| EP | 0 501 456 A3 | 9/1992 |
| EP | 0 511 807 | 11/1992 |
| EP | 0 528 662 | 2/1993 |
| EP | 0 588 721 | 3/1994 |

| | | |
|---|---|---|
| WO | WO 99/40631 | 8/1999 |
| WO | WO 99/53371 | 10/1999 |
| WO | WO 99/54842 | 10/1999 |
| WO | WO 99/54936 | 10/1999 |
| WO | WO 99/66540 | 12/1999 |
| WO | WO 00/07151 | 2/2000 |
| WO | WO 00/33063 | 6/2000 |
| WO | WO 00/36666 | 6/2000 |
| WO | WO 00/76778 | 12/2000 |
| WO | WO 00/79617 | 12/2000 |
| WO | WO 01/03126 | 1/2001 |
| WO | WO 01/06442 | 1/2001 |
| WO | WO 01/08241 | 2/2001 |
| WO | WO 01/15233 | 3/2001 |
| WO | WO 01/17029 | 3/2001 |
| WO | WO 01/17041 | 3/2001 |
| WO | WO 01/27998 | 4/2001 |
| WO | WO 01/35500 | 5/2001 |
| WO | WO 01/46987 | 6/2001 |
| WO | WO 01/47044 A2 | 6/2001 |
| WO | WO 01/47044 A3 | 6/2001 |
| WO | WO 01/47045 | 6/2001 |
| WO | WO 01/69517 | 9/2001 |
| WO | WO 01/73109 A2 | 10/2001 |
| WO | WO 01/73109 A3 | 10/2001 |
| WO | WO 02/05361 | 1/2002 |
| WO | WO 02/17233 | 2/2002 |
| WO | WO 02/29912 | 4/2002 |
| WO | WO 03/027948 | 4/2002 |
| WO | WO 02/43071 | 5/2002 |
| WO | WO 02/071139 | 9/2002 |
| WO | WO 02/071505 | 9/2002 |
| WO | WO 02/076924 | 10/2002 |
| WO | WO 02/091495 A2 | 11/2002 |
| WO | WO 02/091495 A3 | 11/2002 |
| WO | WO 02/095805 | 11/2002 |
| WO | WO 02/095805 A3 | 11/2002 |
| WO | WO 03/036686 | 5/2003 |
| WO | WO 03/038897 | 5/2003 |
| WO | WO 03/046922 | 6/2003 |
| WO | WO 03/057501 | 7/2003 |
| WO | WO 03/067680 | 8/2003 |
| WO | WO 03/069552 | 8/2003 |
| WO | WO 03/081671 | 10/2003 |
| WO | WO 03/095175 | 11/2003 |
| WO | WO 2004/032257 | 4/2004 |
| WO | WO 2004/068267 | 8/2004 |
| WO | WO 2004/083859 | 9/2004 |
| WO | WO 2004/111729 | 12/2004 |
| WO | WO 2005/004194 | 1/2005 |
| WO | WO 2005/022664 | 3/2005 |
| WO | WO 2005/027216 | 3/2005 |

OTHER PUBLICATIONS

U.S. Appl. No. 10/344,926, filed Feb. 12, 2004, Adolf Bernds et al.
U.S. Appl. No. 10/344,951, filed Feb. 12, 2004, Adolf Bernds et al.
U.S. Appl. No. 10/380,113, filed Sep. 25, 2003, Adolf Bernds et al.
U.S. Appl. No. 10/381,032, filed Feb. 12, 2004, Adolf Bernds et al.
U.S. Appl. No. 10/433,961, filed Apr. 1, 2004, Wolfgang Clemens et al.
U.S. Appl. No. 10/473,050, filed May 20, 2004, Adolf Bernds et al.
U.S. Appl. No. 10/479,234, filed Dec. 30, 2004, Adolf Bernds et al.
U.S. Appl. No. 10/479,238, filed Oct. 20, 2004, Adolf Bernds et al.
U.S. Appl. No. 10/492,923, filed Dec. 23, 2004, Wolfgang Clemens et al.
U.S. Appl. No. 10/508,737, filed May 19, 2005, Adolf Bernds et al.
U.S. Appl. No. 10/517,750, filed Oct. 13, 2005, Wolfgang Clemens et al.
U.S. Appl. No. 10/523,216, filed Feb. 2, 2006, Adolf Bernds et al.
U.S. Appl. No. 10/523,487, filed Apr. 13, 2006, Wolfgang Clemens et al.
U.S. Appl. No. 10/524,646, filed May 11, 2006, Walter Fix et al.
U.S. Appl. No. 10/533,756, filed Jun. 8, 2006, Wolfgang Clemens et al.
U.S. Appl. No. 10/534,678, filed Jun. 8, 2006, Wolfgang Clemens et al.
U.S. Appl. No. 10/535,448, filed Jun. 8, 2006, W. Clemens et al.
U.S. Appl. No. 10/535,449, filed Feb. 16, 2006, Walter Fix et al.
U.S. Appl. No. 10/541,815, filed Jun. 8, 2006, Axel Gerlt et al.
U.S. Appl. No. 10/541,956, filed Jun. 15, 2006, Wolfgang Clemens et al.
U.S. Appl. No. 10/541,957, filed Jul. 6, 2006, Walter Fix et al.
U.S. Appl. No. 10/543,561, filed Mar. 8, 2007, Wolfgang Clemens et al.
U.S. Appl. No. 10/542,678, filed Jul. 20, 2006, Adolf Bernds et al.
U.S. Appl. No. 10/562,989, filed Jun. 29, 2006, Jurgen Ficker et al.
U.S. Appl. No. 10/562,869, filed Oct. 5, 2006, Wolfram Glauert.
U.S. Appl. No. 10/569,763, filed Aug. 16, 2007, Walter Fix et al.
U.S. Appl. No. 10/568,730, filed Feb. 8, 2007, Wolfgang Clemens et al.
U.S. Appl. No. 10/569,233, filed Jan. 25, 2007, Adolf Bernds et al.
U.S. Appl. No. 10/570,571, filed Jan. 11, 2007, Clemens et al.
U.S. Appl. No. 10/585,775, Walter Fix et al.
U.S. Appl. No. 11/574,139, filed Mar. 13, 2008, Jurgen Ficker et al.
U.S. Appl. No. 11/721,284, Markus Bohm et al.
U.S. Appl. No. 11/721,219, Wolfgang Clemens et al.
U.S. Appl. No. 11/721,244, Robert Blache et al.
U.S. Appl. No. 11/722,457, Markus Bohm et al.
U.S. Appl. No. 11/817,258, Andreas Ullmann et al.
U.S. Appl. No. 11/817,329, Andreas Ullmann et al.
U.S. Appl. No. 11/911,429, Andreas Ullmann et al.
U.S. Appl. No. 11/994,571, Klaus Ludwig et al.
U.S. Appl. No. 11/997,235, Alexander Knobloch et al.
U.S. Appl. No. 11/989,623, Andreas Ullmann et al.
U.S. Appl. No. 12/065,757, Andreas Ullmann et al.
Angelopoulos M et al., "In-Situ Radiation Induced Doping", Mol. Crystl. Liq. Cryst., 1990, vol. 189, pp. 221-225.
Assadi A, et al:, Field-Effect Mobility of Poly (3-Hexylthiophene) Dept. of Physics and Measurement Technology, Received Mar. 3, 1988; accepted for Publication May 17, 1988.
Backlund, et al, "Towards all-polymer field-effect transistors with solution processable materials", Synthetic Metals, Elsevier Sequoia, Lausanne, CH, vol. 148, No. 1, Jan. 3, 2005, pp. 87-91.
Bao, Z. et al., "High-Performance Plastic Transistors Fabricatecd by Printing Techniques", Chem. Mater vol. 9, No. 6, 1997, pp. 1299-1301.
Bao, Z. et al. "Organic and Polymeric Materials for the Fabrications of Thin Film Field-Effect Transistors", paper presented at the meeting of American Chemical Society, Division of Polymer Chemistry, XX, XX, vol. 39, No. 1, Mar. 29, 1998.
Baude P F et al, "Organic semiconductor RFID transponders" International Electron Devices Meeting 2003. IEDM. Technical Digest. Washington, DC, Dec. 8-10, 2003, New York NY, IEEE, US Dec. 8, 2003, pp. 191-194.
Becker, Eike, et al., "A New Structuring Technique for Polymer Integrated Circuits", Institut fur Hochfrequenztechnik, TU Braunschweit, Germany, Session 4: Polymer Electronic Devices II, pp. 95-97, 2001.
Belloni, F. et al, "Parameters Optimization for Improved Dynamics of Voltage Multipliers for Space", 2004 35$^{th}$ Annual IEEE Electronics Specialists Conference, Aachen, Germany, 2004, pp. 439-442.
Bonse M. et al., "Integrated a-Si:H/Pentacene Inorganic Organic Complementary Circuits" in IEEE, IEDM 98, pp. 249-252, 1998.
Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19, 21, 23, 25, 27, 29, 31, 33.
Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.
Braun D., et al, "Visible light emission from semiconducting polymer diodes", American Institute of Physics, Applied Physics Letters 58, May 6, 1991, pp. 1982-1984.
Brown, A.R. et al., "Field-effect transistors made from solution-processed organic semiconductors", Elsevier Science, S.A., Synthetic Metals 88 (1997) pp. 37-55.
Brown, A.R., "Logic Gates Made from Polymer Transistors and Their Use in Ring Oscillators", Science, vol. 270, Nov. 10, 1995, pp. 972-974.

Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.

Chen, X.L. et al., "Morphological and Transistor Studies of Organic Molecular Semiconductors with Anisotropic Electrical Characteristics", American Chemical Society, 2001, Chem. Mater. 2001, 13, 1341-1348.

Clemens, W. et al., "Vom Organischen Transistor Zum Plastik-Chip," Physik Journal, V. 2, 2003, pp. 31-36.

Collet J. et al:, 'Low Voltage, 30 NM Channel Length, Organic Transistors With a Self-Assembled Monolayer As Gate Insulating Films:, Applied Physics Letters, American Institute of Physics. New York, US, Bd 76, No. 14, Apr. 3, 2000, Seiten 1941-1943, XP000950589, ISSN:0003-6951, das ganze Dokument.

Cox, Robert W. et al., "A Minimally Intrusive, Low Cost System for Determining Indoor Air Flow Patterns", Computers in Power Electronics, 2004. IEEE Workshop on Urbana, IL Aug. 15-18, 2004, Piscataway, NJ, IEEE, Aug. 15, 2004, pp. 63-68.

Crone, B. et al, "Large-scale complementary Integrated circuits based on Organic transistors", Nature, vol. 403, Feb. 3, 2000, pp. 521-.

Crone B. K. et al., "Design and Fabrication of Organic Complementary Circuits", J. Appl. Phys. vol. 89, May 2001, pp. 5125-5132.

Dai, L. et al, Photochemical Generation of Conducting Pattersn in Polybutadiene Films:, Macromolecules, vol. 29, No. 1, 1996, pp. 282-287, XP 001042019, the whole document.

Dai, L. et al., "Conjugation of Polydienes by Oxidants Other Than Iodine", Elsevier Science S.A., Synthetic Metals 86 (1997) 1893-1894.

Dai, L. et al., "$I_2$-Doping" of 1,4-Polydienes*, Elsevier Science S.A., Synthetic Metals 69 (1995), pp. 563-566.

De Leeuw C.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.

Dodabalapur, A. et al., Organic smart pixels, American Institute of Physics, Applied Physics Letters, vol. 73, No. 2, Jul. 13, 1998, pp. 142-144.

Drury et al., "Low-Cost All-Polymer Integrated Circuits", American Institute of Physics, Applied Physics Letters, 1998, vol. 73, No. 1, pp. 108-110, Jul. 6, 1998.

Ficker, J. et al., "Dynamic and Lifetime Measurements of Polymer OFETS and Integrated Plastic Circuits," Proc. of SPIE, v. 466, 2001, pp. 95-102.

Fix, W. et al., "Fast Polymer Integrated Circuits Based on a Polyfluorene Derivative", ESSDERC 2002, 2002, pp. 527-529.

Fix, W., et al., "Fast polymer integrated circuits", American Institute of Physics, Applied Physics Letters, vol. 81, No. 89, Aug. 2002, pp. 1735-1737.

Forrest et al.: "The Dawn of Organic Electronics", IEEE Spectrum, Aug. 2000, Seiten 29-34, XP002189000, IEEE Inc., New York, US ISSN:0018-9235, Seite 33, rechte Spalte, Zelle 58-Seite 34, linke Spalte, Zeile 24; Abbildung 5.

Fraunhofer Magazin—Polytronic Chips Von der Rolle, Apr. 2001, pp. 8-13, 2001.

Garbassi F., et al., "Bulk Modifications", Polymer Surfaces, John Wiley & Sons, 1998, pp. 289-300.

Garnier F et al:, "Vertical Devices Architecture by Molding of Organic-Based Thin Film Transistor", Applied Physics Letters, American Institute of Physics. XP000784120, issn: 0003-6951 abbildung 2, Jul. 6, 1998.

Garnier, F. et al, "All-Polymer Field-Effect Transistor Realized by Printing Techniques", Science, American Association for the Advancement of Science, US, vol. 265, Sep. 16, 1994, pp. 1684-1686.

Garnier et al., "Conjugated Polymers and Oligomers as Active Material for Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

GONCALVES_CONTO, Sylvie, et al., "Interface Morphology in Organic Light-Emitting Diodes", Advanced Materials 1999, vol. 11, No. 2, pp. 112-115.

Gosain, D.P., "Excimer laser crystallized poly-Si TFT's on plastic substrates", Second International Symposium on Laser Precision Microfabrication, May 16-18, 2001, Singapore, vol. 4426, pp. 394-400.

Halls, J.J. M., et al., "Efficient photodiodes from interpenetrating polymer networks", Nature, vol. 376, Aug. 10, 1995, pp. 498-500.

Harsanyi G. et al, "Polytronics for biogtronics:unique possibilities of polymers in biosensors and BioMEMS", IEEE Polytronic 2002 Conference, Jun. 23, 2002, pp. 211-215.

Hart, C.M. et al, "Low-cost all-polymer integrated circuits", Solid-State Circuits Conference, 1998. EXXCIRC '98 Proceedings of the $24^{th}$ European, The Hague, The Netherlands Sep. 22-24, 1998, Piscataway, NJ, USA, IEEE, Sep. 22, 1998, pp. 30-34.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Hergel, H. J.: "Pld-Programmiertechnologien", Elektronik, Franzis Verlag GMBH. Munchen, DE, Bd 41, No. 5, Mar. 3, 1992, Seiten 44-46, XP000293121, ISSN: 0013-5658, Abbildungen 1-3.

Hofstraat, Hans, "Will Polymer Electronics Change the Electronics Industry?", Philips Research, Keynote Session, Department Polymers & Organic Chemistry and University of Amsterdam, The Netherlands, 2001.

Hwang J D et al:, "A Vertical Submicron Slc thin film transistor", Solid State Electronics, Elsevier Science Publishers, Barking, GB, Bd. 38, No. 2,Feb. 1, 1995, Seiten 275-278, XP004014040, ISSN:0038-1101, Abbildung 2.

IBM Technical Disclosure Bulletin, "Short-Channel Field-Effect Transistor", IBM Corp., New York, US, Bd. 32, No. 3A, Aug. 1, 1989, Seiten 77-78, XP000049357, ISSN:0018-8689, das ganze Dokument.

Ishiwara, Hiroshi, "Current Status and Prosepcts of Ferroelectric Memories", Frontier Collaborative Research Center, Tokyo Institute of Technology, Yokohama, Japan, IEDM 725-728, 2001.

Kamba, S. et al., "Dielectric dispersion of the relaxor PLZT ceramics in the frequency rangee 20Hz-100 THz", J. Phys.: Condens. Matter 12 (2000), pp. 497-519.

Kawase, T., et al., "Inkjet Printed Via-Hole Interconnections and Resistors for All-Polymer Transistor Circuits", Advanced Materials 2001, 13, No. 21, Nov. 2, 2001, pp. 1601-1605.

Kawase, T. et al., "Inkjet printing of polymer thin film transistors", Thin Solid Films 438-439 (2003) 279-287.

Kind, D., "Einfuhrung in die Hochspannungs-Versuchstechnik", Friedrich. Vieweg & Sohn, Braunschweig/Wiesbaden, pp. 16-21, 1978.

Klauk, H. et al., "Fast Organic Thin Film Transistor Circuits", IEEE Electron Device Letters, vol. 20, No. 6, pp. 289-291, Jun. 1999.

Klauk, H. et al., "Pentacene Thin Film Transistors and Inverter Circuits", 1997 International Exectron Devices Meeting Technical Digest, pp. 539-542, Dec. 1997.

Kleim, Herbert et al., "Dielectric Permittivity of $Si_3$ N and $SiO_4$ Increased by Electrode Profile and Material", 1999 Conference on Electrical Insulation and Dielectric Phenomena.

Knobloch, A. et al., "Printed Polymer Transistors", Proc. Polytronic, v. 84, 2001, pp. 84-89.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Koezuka, H. et al., "Macromolecular Electronic Device", Mol. Cryst. Liq. Cryst. 1994, vol. 2555, pp. 221-230.

Kuhlmann et al., "Terabytes in Plastikfolie", Organische Massenspeicher vor der Serienproduktion, 1998.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Kymissis, Ioannis, et al., "High-Performance Bottom Electrode Organic Thin-Film Transistors", IEEE Transactions on Electron Devices, Vol, 48, No. 6, Jun. 2001, pp. 1060-1064.

Lidzey, D. G. et al., "Photoprocessed and Micropatterned Conjugated Polymer LEDs", Synthetic Metals, V. 82, 1996, pp. 141-148.

Lowe, J. et al., "Poly(3-(2-Acetoxyethyl)Thiophene): A Model Polymer for Acid-Catalyzed Lithography", Synthetic Metals, Elsevier Sequoia, Lausanne, CH, Bd. 85, 1997, Seiten 1427-1430.

Lu, Wen et al., "Use of Ionic Liquids for π-Conjugated Polymer Electrochemical Devices", Science, vol. 297, 2002, pp. 983-987.

Lucent Technologies, "Innovation marks significant milestone in the development of electronic paper", Cambridge, MA and Murray Hill, NJ, Nov. 20, 2000. XP-002209726.

Manuelli, Alessandro et al., "Applicability of Coating Techniques for the Production of Organic Field Effect Transistors", IEEE Polytronic 2002 Conference, 2002, pp. 201-204.

Marko, H., Vorlesungsmanuskript "Nachrichtentechnik 2 (Modulationsverfahren" des Lehrstuhls fur Nachrichtentechnik der Technischen Universitat Munchen, 1989.

Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.

Nalwa, H.S., "Organic Conductive Molecules and Polymers", Vol, 2, 1997, pp. 534-535.

Oelkrug, D. et al., "Electronic spectra of self-organized oligothiophene films with 'standing' and 'lying' molecular units", Elsevier Science S.A., 1996, Thin Solid Films 284-270.

"New Plastic Circuits are Flexible Enough to be Folded in Half", Internet Citation, (On line) Dec. 8, 1997, pp. 1-3, www.research.philips.com/pressmedia/releases/97005E.html.

Qiao, X. et al., "The FeCI3-doped poly3-alkithiophenes) in solid state", Elsevier Science, Synthetic Metals 122 (2001) pp. 449-454.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402, Jan. 13, 1999.

Redinger, David et al., "An all-printed passive component technology for low-cost RFID", Device Research Conterence, Jun. 23, 2003, pp. 187-188.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9648, das ganze Dokument.

Rogers, J.A. et al., "Organic Smart Pixels and Complementary Inverter Circuits Formed on Plastic Substrates by Casting and Rubber Stamping", IEEE Electron Devices Letters, vol. 21, No. 3, Mar. 2000, pp. 100-103.

Roman et al., "Polymer Diodes With High Rectification", Applied Physics Letters, vol. 75, No. 21, Nov. 22, 1999.

Rost, Henning et al., "All-Polymer Organic Field Effect Transistors", Proc. Mat. Week, CD, 2001, pp. 1-6.

Sandberg, H. et al, "Ultra-thin Organic Films for Field Effect Transistors", SPIE vol. 4466, 2001, pp. 35-43.

Schoebel, "Frequency Conversion with Organic-On-Inorganic Heterostructured Diodes", Extended Abstracts of the International Conference on Solid State Devices and Materials, Sep. 1, 1997.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr, Seitenn 91-94, 2001.

Shaheen, S.E., et al., "Low band-gap polymeric photovoltaic devices", Synthetic Metals, vol. 121, 2001, pp. 1583-1584.

Speakman, S.P. et al., High performance organic semiconducting thin films: Ink Jet printed polythophene [π-P3HT], Organic Electronics 2 (2), 2001, pp. 65-73.

Subramanian, V.. et al., "Printed Organic Transistors for Ultra-low-cost RFID Applications", Polymers and Adhesives in Microelectronics and Photonics, 2004, Polytronic 2004. 4th IEEE International Conference, Portland, OR, USA, Sep. 12-15, 2004, Piscataway, NJ, pp. 67-71.

Takashima, W. et al., Electroplasticity Memory Devices Using Conducting Polymers and Solid Polymer Electrolytes, Polymer International, Melbourne, 1992, pp. 249-253.

Ullman, A. et al., "High Performance Organic Field-Effect Transistors and Integrated Inverters", Mat. Res. Soc. Symp. Proc., v. 665, 2001, pp. 265-270.

Velu, G. et al. "Low Driving Voltages and Memory Effect in Organic Thin-Film Transistors With a Ferroelectric Gate Insulator", Applied Physics Letters, American Institute of Physics, New York, vol. 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Wang, Yading et al., "Electrically Conductive Semiinterpenetrating Polymer Networks of Poly(3-octylthiophene)", Macromolecules 1992, vol. 25, pp. 3284-3290, 1992.

Weiss, Ray, "Flash Memory Takes Over", Electronic Design Online ID#3756, Aug. 20, 2001.

Yasufuki, Sachio et al., "Dielectric and Thermoanalytical Behaviour of Moisture and Water in Aromatic Polyamide and Polymide Films", Conference Record of the 1994 IEEE International Symposium on Electrical Insulation, Pittsburgh, PA, USA, Jun. 5-8, 1994.

Yu, G. et al., "Dual-function semiconducting polymer devices: Light-emitting and photodetecting diodes", American Institute of Physics, Applied Physics Letter 64, Mar. 21, 1994, pp. 1540-1542.

Zangara L., "Metall Statt Halbleiter, Programmierung Von Embedded ROMS Ueber Die Metallisierungen", Elektronik, Franzis Verlag GmbH, Munchen, DE, vol. 47, No. 16, Aug. 4, 1998, pp. 52, 54.

Zheng, Xiang-Yang et al., "Electrochemical Patterning of the Surface of Insulators with Electrically Conductive Polymers", J. Electrochem. Soc., v. 142, 1995, pp. L226-L227.

* cited by examiner

ELECTRONIC CIRCUIT WITH ELONGATED STRIP LAYER AND METHOD FOR THE MANUFACTURE OF THE SAME

The invention relates to an electronic circuit comprising at least two electronic components on a common flexible substrate, wherein the at least two electronic components in each case have at least one electrical functional layer composed of identical functional layer material. The invention furthermore relates to a method for the manufacture of an electronic circuit comprising at least two electronic components on a common flexible substrate, wherein the at least two electronic components are in each case formed with at least one electrical functional layer composed of identical functional layer material.

WO 2004/032257 A2 discloses a method for the manufacture of a film, wherein the film comprises at least one component using organic technology, in particular one or a plurality of field effect transistors. The structuring of one or a plurality of layers of the component is effected in this case by thermal replication or UV replication. In this case, a layer to be replicated which is applied in large-area fashion is partially severed by the replication and an electrical functional layer structured in patterned fashion is formed. However, a large-area layer application of the layer to be replicated is not always possible, for space reasons, and furthermore leads to an increased material consumption.

Electrical functional layers that are applied to a substrate already in the final form are realized for example by means of printing methods. The application of printing methods in the manufacture of electronic components enables said components to be mass-produced inexpensively at high process speeds. A speed of the substrate in the printing direction during printing of at least 0.5 m/min, preferably within the range of 5 to 200 m/min, is preferably chosen. In order to ensure electrical values that are as uniform as possible and the functionality of the electronic component, the individual electrical functional layers from which the electronic component is constructed must be formed one after another and in this case be positioned one above another in the correct position and arrangement in accordance with a predetermined layout.

Furthermore, with regard to the electrical properties and short response times of a component it is necessary to minimize the layer thicknesses of electrical functional layers. In order to be able to achieve this for example in the case of printed electrical functional layers, it is necessary to use printing media of ever lower viscosity.

At the high process speeds required during the formation of an electrical functional layer using a medium of low viscosity, firstly the problem then arises that inexact edges for the electrical functional layer are formed during the only partial, that is to say patterned application of an electrical functional layer. The edge or the margin of the electrical functional layer is unsharp in the region of the separating line since the printing medium, opposite to the direction of movement of the substrate, is pressed, pulled or spun beyond the desired, ideal boundary line on account of the high process speed. The smearing is all the worse, the lower the viscosity of the medium. However, the effect is always present (microscopically), that is to say also in the case of printing media of high viscosity. The more critical the dimensions, the more pronounced this effect is even in the case of media of high viscosity. Moreover, functional layers that smear out in the printing direction do not permit precise alignment of further functional layers that are to be arranged above them.

At the high process speeds required during the formation of an electrical functional layer using a medium of low viscosity, the problem furthermore arises that during application in already structured form, that is to say in the end form for the respective functional layer, it is not possible to form a sufficiently uniform layer thickness over the area of the respective functional layer. The effect particularly occurs in the vicinity of the edge of the functional layer.

It is an object of the invention, then, to provide an electronic circuit and a method for the manufacture of an electronic circuit which overcome the disadvantages of the prior art.

The object is achieved for the electronic circuit comprising at least two electronic components on a common flexible substrate, wherein the at least two electronic components in each case have at least one electrical functional layer composed of identical functional layer material, by virtue of the fact that the electrical functional layers composed of identical functional layer material are formed from layer regions of a layer formed in strip-type fashion on the substrate.

The object is achieved for the method for the manufacture of an electronic circuit comprising at least two electronic components on a common flexible substrate, wherein the at least two electronic components in each case are formed with at least one electrical functional layer composed of identical functional layer material, by virtue of the fact that at least one strip-type layer is formed on the substrate, and in that the electrical functional layers composed of identical functional layer material are formed from layer regions of an individual strip-type layer.

A strip-type application of functional layer material on a substrate enables a space-saving and at the same time uniformly thick layer application with clean contours. A substrate which is prepared in this way and which is provided with at least one strip-type layer composed of functional layer material can be used diversely and can be adapted individually to the respective desired electronic circuit.

It has proved to be particularly worthwhile if the layer formed in strip-type fashion on the substrate is formed in a continuous process on the substrate in a specific application direction. The layer formed in strip-type fashion on the substrate is preferably a printed layer or a layer formed by applying a liquid medium on the substrate.

In particular, in this case the continuous process used is a printing method, in particular a printing method from the group of intaglio printing, relief printing, screen printing, or the continuous process used is some other coating method (for example blade coating, spin-coating, spraying or inkjet printing) that applies a liquid medium for forming the at least one strip-type layer to the substrate. During the printing of a strip-type layer, the application direction therefore corresponds to the printing direction. In particular, it is preferred for the method according to the invention if a printing tool that is unrolled on the substrate at least in regions is used for printing the at least one strip-type layer. By way of example, printing rollers or flexible rubber tools such as pads are suitable here as printing tools.

In this case, a printing medium or liquid medium having a dynamic viscosity of less than 200 mPas, in particular less than 50 mPas, as considered at a temperature of 20° C., is preferred for forming the at least one strip-type layer. Media of such low viscosity make it possible to form extremely thin electrical functional layers whilst at the same time improving the performance features of the electronic component produced therewith.

It has proved to be worthwhile if a first electronic component of the at least two electronic components has a first electrical functional layer, and a second electronic component of the at least two electronic components has a second electrical functional layer, wherein the first and the second electrical functional layer are formed from identical functional layer material, wherein the first and the second electrical functional layer are arranged on the substrate in such a way that they are arranged one after another or alongside one another in the application direction.

It is particularly preferred if the layer formed in strip-type fashion on the substrate is a semiconducting or an electrically insulating layer, in particular an organic semiconducting or an organic electrically insulating layer. However, an electrically conductive, if appropriate organic electrically conductive, strip-type layer can also be used.

Polythiophene, for example, is suitable as organic semiconductor material. Polyvinyl phenol, inter alia, has proved to be worthwhile as organic insulation material. Inorganic semiconductor or insulation material can be vapor-deposited, sputtered or inserted by means of pastes containing semiconducting or electrically insulating inorganic particles, in particular nanoparticles.

It is particularly advantageous to form the substrate with a plurality of strip-type layers which are arranged parallel alongside one another and which are formed from different functional layer materials. By means of a subsequent coating of individual regions with further, if appropriate in turn strip-type layers, it is possible to construct therefrom the components required for forming the electronic circuit.

For forming the individual components of the electronic circuit it may become necessary for the layer formed in strip-type fashion on the substrate to be interrupted and/or subdivided into mutually independent layer regions, wherein, as seen over the cross section of the layer formed in strip-type fashion on the substrate, at least one continuous opening is formed in the layer formed in strip-type fashion on the substrate.

In this case, it has proved to be worthwhile if the layer formed in strip-type fashion on the substrate is subdivided in the application direction and/or perpendicular to the application direction. The use of a laser beam, embossing, cutting, grinding or scratching have proved to be worthwhile as suitable methods for structuring the at least one strip-type layer.

Preferably, the at least one opening in the layer formed in strip-type fashion on the substrate forms a via by means of which an electrical contact is formed between electrical functional layers arranged, as seen perpendicular to the substrate plane (x-y plane), above and below the layer formed in strip-type fashion on the substrate. This therefore enables a connection in the third dimension (z plane) between functional layers.

It has proved to be expedient if an opening has a width within the range of 1 µm to 10 mm, preferably of 50 µm to 2 mm. Such dimensions can be realized with high accuracy for example by intaglio or relief printing when using the method according to the invention. Such widths ensure a sufficient electrical isolation of layer regions of a strip-type layer and furthermore a sufficient material uptake capacity (for example for taking up printing paste) during the formation of plated-through holes by means of such an opening.

It has proved to be worthwhile if at least one electronic component is formed as a transistor, in particular as a field effect transistor. In particular, it has proved to be worthwhile if the at least two electronic components are in each case formed as field effect transistors, wherein the field effect transistors in each case have a semiconducting electrical functional layer composed of identical functional layer material, which are formed from layer regions of a semiconducting layer formed in strip-type fashion on the substrate, and wherein the field effect transistors in each case have an electrically insulating electrical functional layer composed of identical functional layer material, which are formed from layer regions of an electrically insulating layer formed in strip-type fashion on the substrate.

Furthermore, it has proved to be advantageous if at least one electronic component is formed as a diode. In particular, it is advantageous if the at least two electronic components are in each case formed as diodes, wherein the diodes in each case have a semiconducting electrical functional layer composed of identical functional layer material, which are formed from layer regions of a semiconducting layer formed in strip-type fashion on the substrate.

Furthermore, it has proved to be worthwhile if at least one electronic component is formed as a nonreactive resistor. In particular, it is advantageous if the at least two electronic components are in each case formed as nonreactive resistors, wherein the resistors in each case have a functional layer composed of identical functional layer material, which are formed from layer regions of a layer formed in strip-type fashion on the substrate.

Furthermore, it has proved to be advantageous if at least one electronic component is formed as a capacitor. In particular, it is advantageous if the at least two electronic components are in each case formed as capacitors, wherein the capacitors in each case have an electrically insulating functional layer composed of identical functional layer material, which are formed from layer regions of an electrically insulating layer formed in strip-type fashion on the substrate.

For continuous processes, in particular, it has proved to be expedient if the flexible substrate is formed in tape-type fashion. At least during the formation of the at least one strip-type layer, the substrate can thereby be transported conveniently from roll to roll. In this case, the uncoated flexible substrate is wound up onto a roll, the substrate is unwound from the roll and guided for example through a printing machine, printed in the process and finally wound up as printed substrate onto a further roll. This makes it possible to process long substrate tapes, wherein the positioning with respect to the printing machine only has to be performed once at the beginning of a new substrate roll.

In this case, it is particularly preferred if the at least one layer formed in strip-type fashion on the substrate is arranged parallel to a longitudinal side of the tape-type substrate, that is to say that the application direction is arranged parallel to a longitudinal side of the tape-type substrate. As a result, a strip-type layer can be formed continuously on the substrate from the start of the roll to the end of the roll, thereby increasing the uniformity of the layer (with regard to layer thickness, width and surface roughness).

The flexible substrate can be formed in multilayered fashion. It is particularly preferred if the flexible substrate used is an elongated plastic film, which is multilayered, if appropriate. By way of example, plastic films composed of polyester, polyethylene, polyethylene terephthalate (PET) or polyimide are suitable in this case. It has proved to be worthwhile if a thickness of the flexible substrate within the range of 6 µm to 200 µm, preferably within the range of 12 µm to 50 µm, is chosen.

It has proved to be worthwhile if at least two, in particular two to twenty, layers formed in strip-type fashion on the substrate are arranged parallel to one another on the substrate. In this case, the width of such a strip-type layer is preferably 50 µm to 2000 µm. The preferred distance between two strip-type layers arranged adjacent and parallel to one another is in this case 2000 µm to 50 000 µm.

It is particularly preferred if the at least two layers formed in strip-type fashion on the substrate, as seen in the substrate cross section, are arranged in one plane and/or in different planes on the substrate. Three-dimensional circuits can thereby be produced in a simple manner.

It is advantageous if the at least two electronic components in each case have at least two electrical functional layers composed of different functional layer materials, wherein in each case one of the at least two electrical functional layers of the at least two components is formed by a structuring of a strip-type layer that is therefore used jointly by the at least two electronic components. This ensures an optimum arrangement of components and utilization of strip-type layers.

It has proved to be worthwhile that a first electronic component of the at least two electronic components has a first electrical functional layer, and wherein a second electronic component of the at least two electronic components has a second electrical functional layer, wherein the first and the second electrical functional layer are formed from identical functional layer material, wherein the first and the second electrical functional layer are arranged on the substrate in such a way that they are arranged one after another or alongside one another as seen in the application direction.

Preferably, the layer formed in strip-type fashion on the substrate is formed with a layer thickness within the range of 1 nm to 300 μm, in particular within the range of 1 nm to 300 nm.

The at least two electronic components usually furthermore have electrically conductive, in particular organic or metallic, functional layers. The latter can be formed by means of printing, vapor disposition or sputtering (before or after the formation of strip-type layers) on the uncoated substrate or an already coated substrate.

Electrically conductive materials, in particular conductive polymers or metals or metal alloys, e.g. composed of vapor-deposited or sputtered gold or silicon, or conductive pastes with gold, silver or conductive inorganic nanoparticles are appropriate in this case. Here conductive "organic" materials are considered to be all types of organic, organometallic and inorganic plastics. Accordingly, a restriction in the dogmatic sense to organic material as material containing carbon is not envisaged, rather the use of silicones, for example, is also conceived of. Furthermore, the term is not intended to be subject to any restriction whatsoever with regard to the molecular size, in particular to polymeric and/or oligomeric materials, rather the use of "small molecules" is also entirely possible. Polyaniline or polypyrrol, inter alia, have proved to be worthwhile as electrically conductive organic materials.

The electronic circuit is preferably an organic circuit. However, it has equally proved to be worthwhile if the organic circuit has components having only organic electrical functional layers, and/or has components having organic and inorganic electrical functional layers.

FIGS. 1a to 7b are intended to elucidate the invention by way of example. Thus:

FIG. 1a shows a tape-type substrate with four strip-type layers,

FIG. 1b shows a cross section through the substrate from FIG. 1a,

FIG. 6b shows a cross section through the substrate from FIG. 6a, FIG. 7a shows an excerpt from an electronic circuit in plan view, FIG. 7b shows a cross section through the circuit in FIG. 7a.

Figures 1A, 1B:
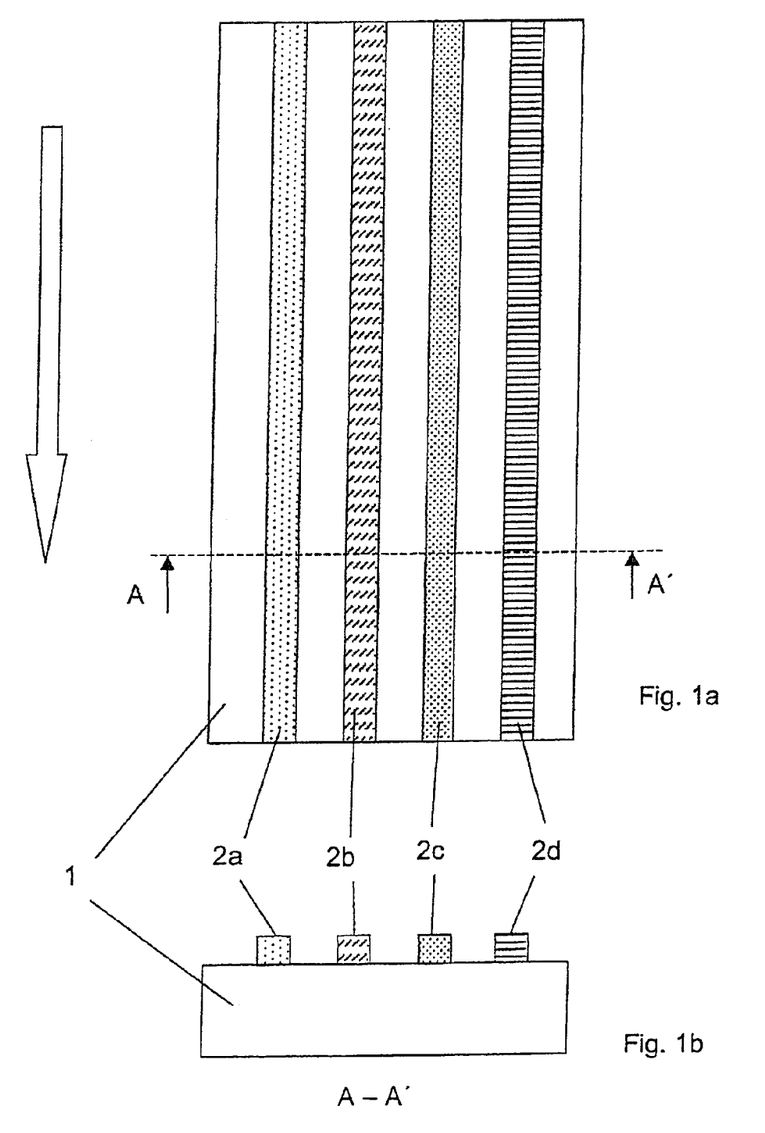

FIG. 1a shows a flexible tape-type substrate 1 composed of PET with four strip-type layers 2a, 2b, 2c, 2d arranged longitudinally on the tape-type substrate 1 and parallel to one another. The four strip-type layers 2a, 2b, 2c, 2d are printed onto the substrate 1 by the intaglio printing method, the arrow on the left in FIG. 1a indicating the printing direction. The four strip-type layers 2a, 2b, 2c, 2d are applied parallel to the printing direction over the entire length of the substrate 1. The strip-type layer 2a is formed in organic and electrically conductive fashion, the strip-type layer 2b is formed in organic and semiconducting fashion, the strip-type layer 2c is once again formed in organic and electrically conductive fashion, and the strip-type layer 2d is formed in organic and electrically insulating fashion. The strip-type layers 2a, 2b, 2c, 2d are then used either in unchanged form or else in structured form as electrical functional layers for the construction of electronic components. Further, if appropriate once again strip-type, electrical functional layers are applied for the construction of electronic components on the substrate 1, said layers being connected to form the desired electronic circuit. The strip-type application of the functional layer material by means of a printing medium results in a particularly uniform layer thickness and contour of the later functional layers of the electronic components.

FIG. 1b shows the cross section A-A' through the substrate 1 and the four strip-type layers 2a, 2b, 2c, 2d in FIG. 1a.

Figure 2A:
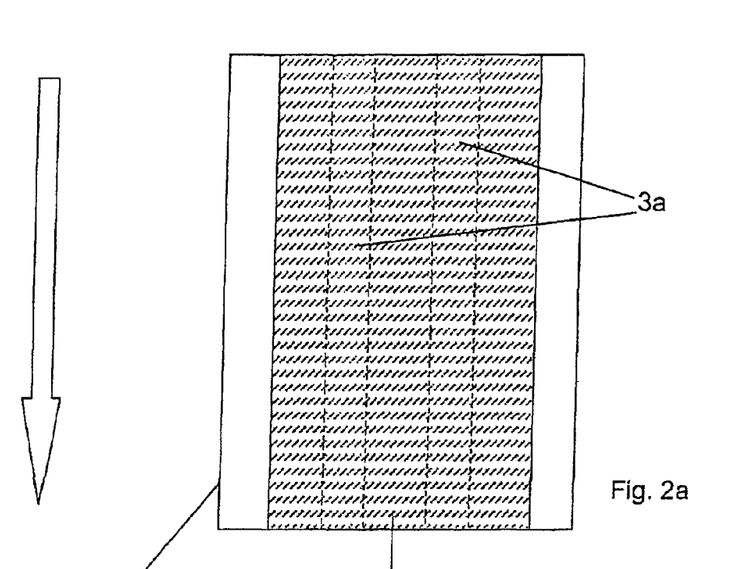
FIG. 2a shows a tape-type substrate with one strip-type layer.

FIG. 2a shows a flexible tape-type substrate 1 with one strip-type layer 2b composed of organic semiconducting functional layer material, here polythiophene. The strip-type layer 2b is printed longitudinally on the substrate 1, the arrow on the left in the figure denoting the application direction. The illustration identifies layer regions 3a of the strip-type layer 2b which are oriented in the longitudinal direction of the substrate 1 and in which, after the formation of the strip-type layer 2b, a cut is to be effected by means of a laser in order to provide the strip-type layer 2b with openings 4a (see FIG. 2b).

Figure 2B:
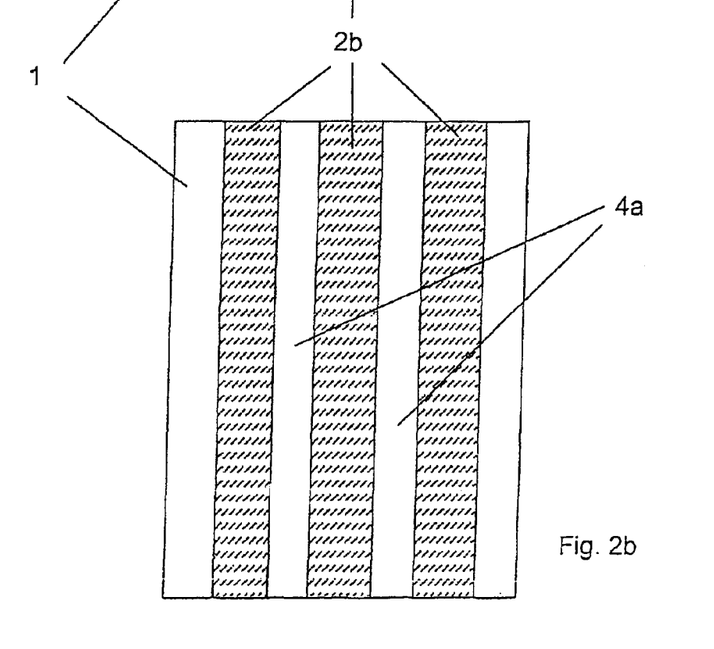
FIG. 2b shows the substrate from FIG. 2a after a laser treatment.

FIG. 2b then shows the substrate 1 and the strip-type layer 2b from FIG. 2a after the laser treatment, wherein the strip-type layer 2b was divided into three strips that are parallel in the longitudinal direction of the substrate 1 and are separated from one another. The three strip-type layers 2b are then used, if appropriate after a further structuring, as electrical functional layers for the construction of electronic components. Further, if appropriate once again strip-type, electrical functional layers are applied for the construction of electronic components on the substrate 1, said layers being connected to form the desired electronic circuit. The strip-type application of the functional layer material by means of a printing medium results in a particularly uniform layer thickness and contour of the later functional layers of the electronic components.

Figure 3A:
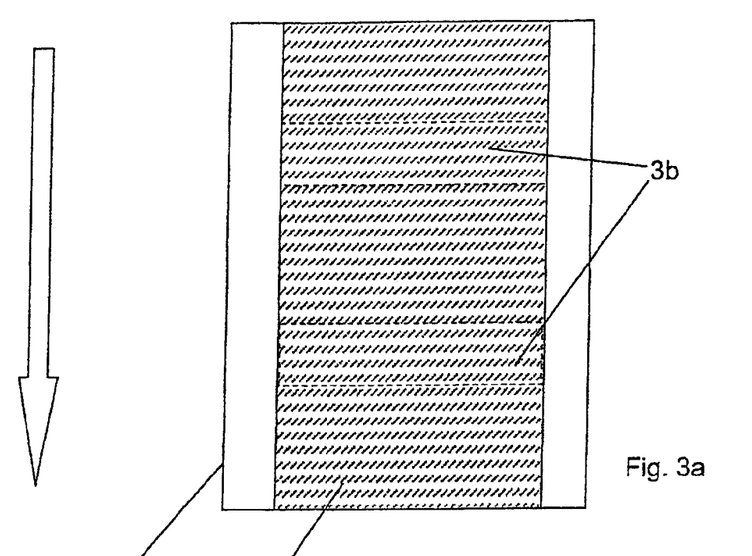
FIG. 3a shows a tape-type substrate with one strip-type layer.

FIG. 3a likewise shows a flexible tape-type substrate 1 with one strip-type layer 2b composed of organic semiconducting functional layer material, here polythiophene. The strip-type layer 2b is printed longitudinally on the substrate 1, the arrow on the left in the figure denoting the application direction. The illustration identifies layer regions 3b in the strip-type layer 2b which are oriented in the transverse direction of the substrate 1 and in which, after the formation of the strip-type layer 2b, a cut is to be effected by means of a laser in order to provide the strip-type layer 2b with openings 4b (see FIG. 3b).

Figure 3B:
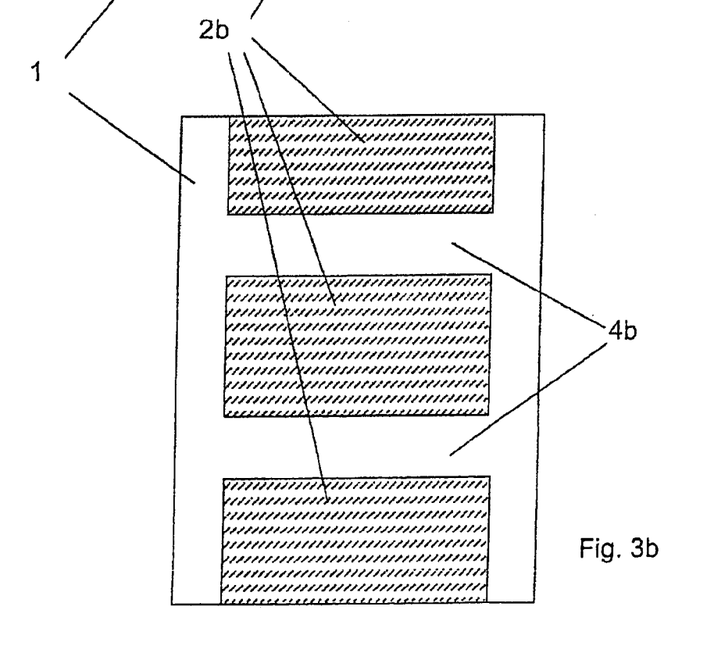
FIG. 3b shows the substrate from FIG. 3a after a laser treatment.

FIG. 3b then shows the substrate 1 and the strip-type layer 2b from FIG. 3a after the laser treatment, wherein the strip-type layer 2b was divided into three strips that are parallel in the transverse direction of the substrate 1 and are separated from one another. The three strip-type layers 2b are then used, if appropriate after a further structuring, as electrical functional layers for the construction of electronic components. Further, if appropriate once again strip-type, electrical functional layers are applied for the construction of electronic components on the substrate 1, said layers being connected to form the desired electronic circuit. The strip-type application of the functional layer material by means of a printing medium results in a particularly uniform layer thickness and contour of the later functional layers of the electronic components.

Figure 4A:
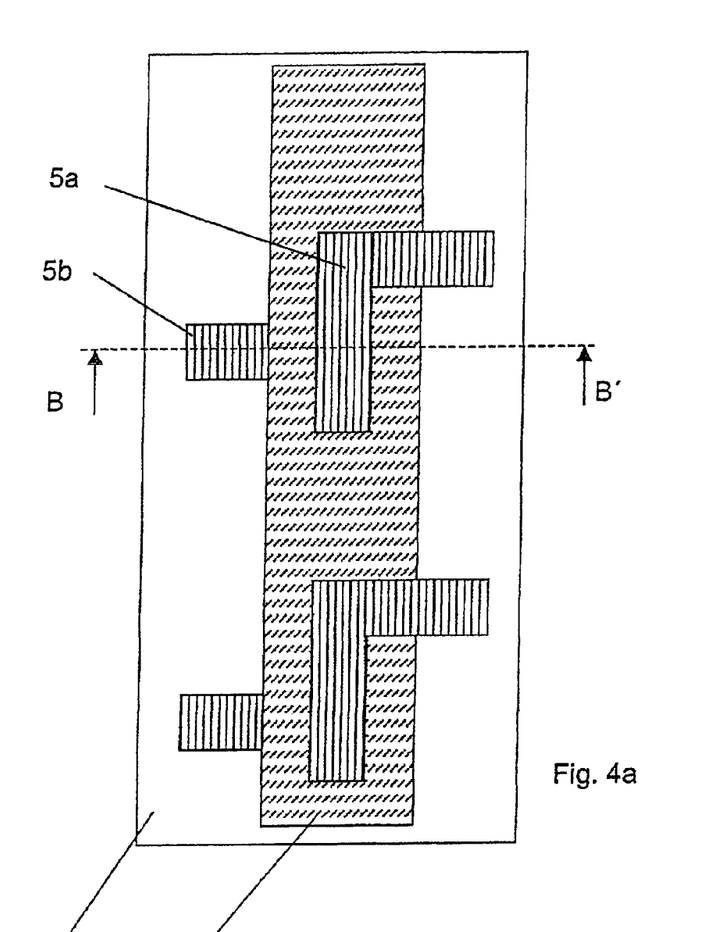
FIG. 4a shows a tape-type substrate with one strip-type layer and further electrical functional layers.

FIG. 4a shows a flexible tape-type substrate 1 composed of PET with a printed, organic semiconducting and strip-type layer 2b, here composed of polythiophene, and further, electrically conductive functional layers 5a, 5b composed of sputtered gold. In this case, the functional layer 5b composed of gold was formed directly on the substrate 1, the strip-type layer 2b was printed in a manner oriented longitudinally on the tape-type substrate 1 and, finally, the functional layer 5a was formed from gold. A unit comprising electrically conductive functional layers 5a, 5b and organic semiconducting layer 2b arranged in between forms a respective diode. A strip-type electrically insulating layer—not shown here—could optionally be arranged here over the whole area between the organic semiconducting layer 2b and the electrically conductive functional layer 5a, said electrically insulating layer having a via or an opening in the region between the organic semiconducting layer 2b and the electrically conductive functional layer 5b. A direct contact between the organic semiconducting layer 2b and the electrically conductive functional layer 5a is possible by means of the via.

Figure 4B:
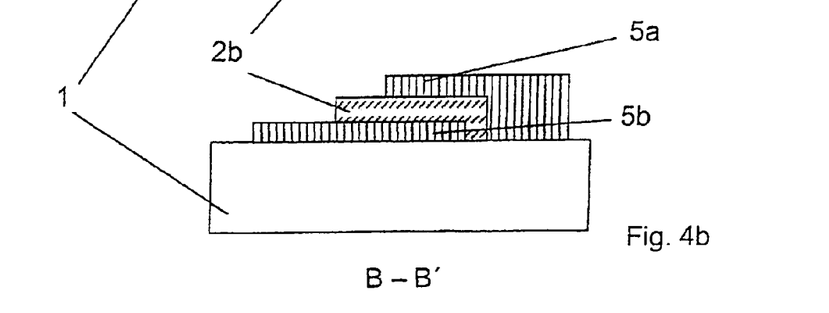
FIG. 4b shows a cross section through the substrate from FIG. 4a, FIG. 5a shows a tape-type substrate with a subdivided strip-type layer and further strip-type electrical functional layers.

FIG. 4b shows the cross section B-B' through the substrate 1 and the layers 5a, 2b, 5b arranged thereon from FIG. 4a in the region of a diode. It can be discerned that the electrically conductive functional layers 5a, 5b composed of gold, which form electrodes here, overlap in the region of the strip-type layer 2b. Consequently, a respective diode is formed locally by each unit comprising a functional layer 5b, the strip-type layer 2b above the functional layer 5b and the functional layer 5a arranged above the latter. In this case, two diode units can be discerned in FIG. 4a. An illustration of the interconnection of the diodes or the linking thereof into an electronic circuit was dispensed with here for reasons of clarity. Thus, the electrodes 5a, 5b must also be correspondingly contact-connected to conductor tracks in order to realize an interconnection of the components among one another.

Figure 5A:
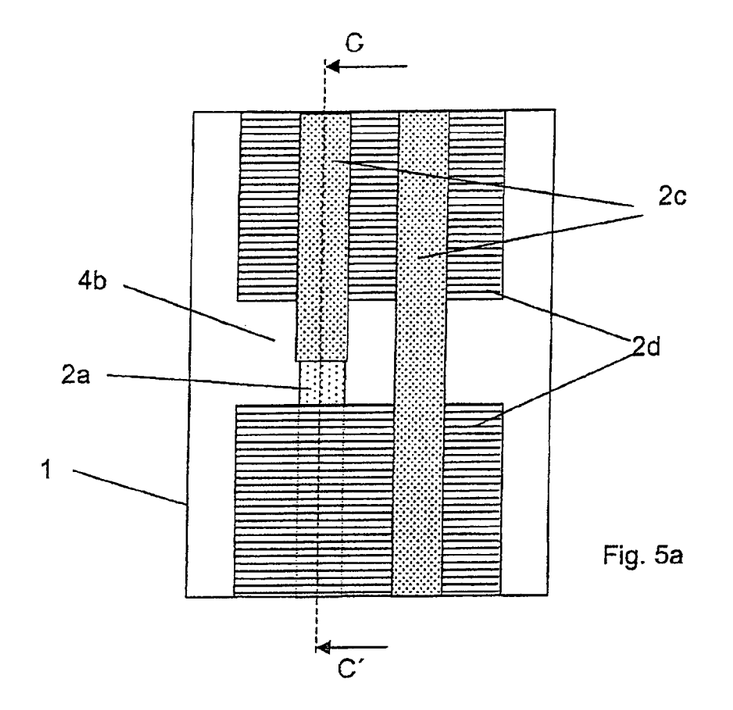

FIG. 5a shows a flexible tape-type substrate 1 with a strip-type layer 2d composed of electrically insulating functional layer material, here polyvinyl phenol. A strip-type layer 2a composed of electrically conductive functional layer material is formed in regions on the substrate 1 in the longitudinal direction, here by printing. The strip-type layer 2a composed of electrically conductive functional layer material is furthermore overprinted with a strip-type layer 2d composed of electrically insulating functional layer material that is formed over the entire length of the substrate 1. A laser treatment of the strip-type layer 2d composed of electrically insulating functional layer material is then effected, wherein an opening 4b is formed perpendicular to the longitudinal direction of the substrate 1. A region of the strip-type layer 2a is uncovered as a result of the formation of the opening 4b. In a next step, the two strip-type layers 2c are formed simultaneously by printing, said layers likewise being formed from electrically conductive functional layer material. An electrically conductive connection between the strip-type layer 2a and the strip-type layer 2c arranged on the left is formed in the region of the opening 4b (also see FIG. 5b). The opening 4b accordingly functions as a so-called via that enables a three-dimensional interconnection of electrical functional layers.

Figure 5B:
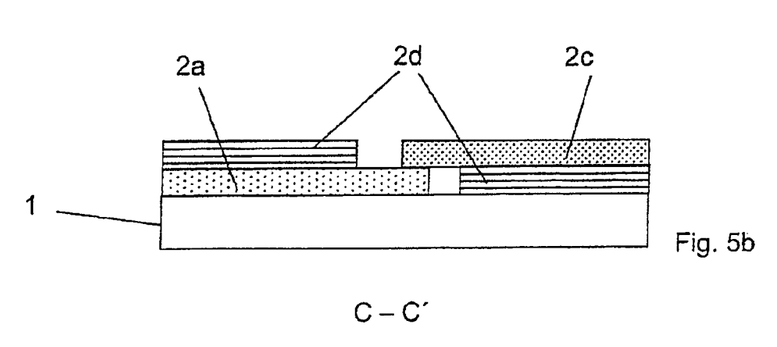
FIG. 5b shows a longitudinal section through the substrate from FIG. 5a, FIG. 6a shows a tape-type substrate with a subdivided strip-type layer and a further strip-type layer.

FIG. 5b shows the longitudinal section C-C' through the substrate 1 from FIG. 5a in order to illustrate the formation of the electrically conductive connection in the region of the via.

Figures 6A, 6B:
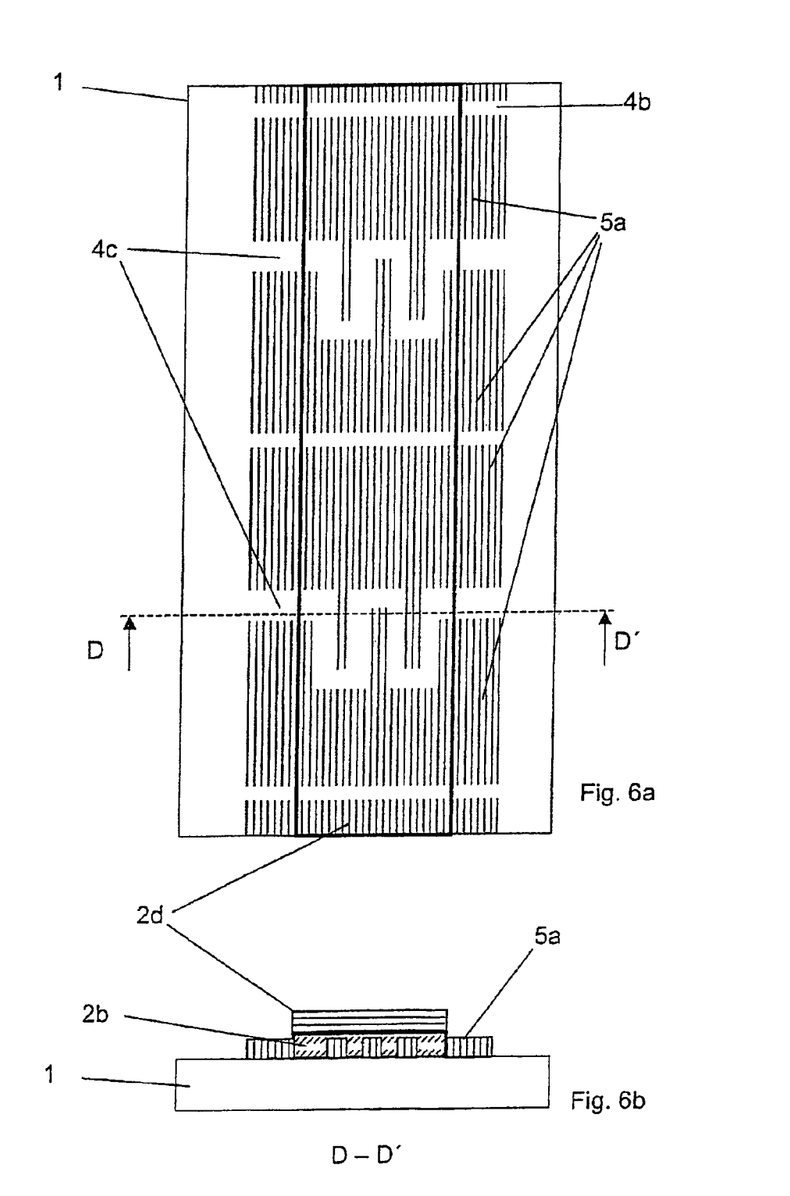

FIG. 6a shows a flexible tape-type substrate 1 composed of PET with a strip-type layer 5a composed of electrically conductive functional layer material, here polyaniline or gold, said strip-type layer having been repeatedly subdivided by means of a laser. Thus, openings 4b running in rectilinear fashion and openings 4c running in meandering fashion were formed and two further strip-type layers, one a semiconducting layer 2b (not illustrated) and furthermore a layer 2d composed of electrically insulating functional layer material, here polyvinyl phenol, were formed one above another. In FIG. 6a, layer 2d is shown in phantom with dashed lines to illustrate its relative position. Here the layer regions of the strip-type layer 5a before and after a meandering opening 4c and also the strip-type layers 2b, 2d arranged above the meander in each case form a separate unit that forms a resistor. The leakage current of the semiconductor causes the resistance. Two resistor units can therefore be discerned in FIG. 6a. An illustration of the interconnection of the resistors or the linking thereof into an electronic circuit was dispensed with here for reasons of clarity. Thus, the layer regions 5a before and after a meander, which form the electrodes of a resistor, must also be correspondingly contact-connected to conductor tracks in order to realize an interconnection of the components.

FIG. 6b shows the cross section D-D' through the substrate 1 from FIG. 6a, wherein the semiconductor layer 2b can be seen between the strip-type layer 5a and the electrically insulating layer 2d.

Figure 7A:
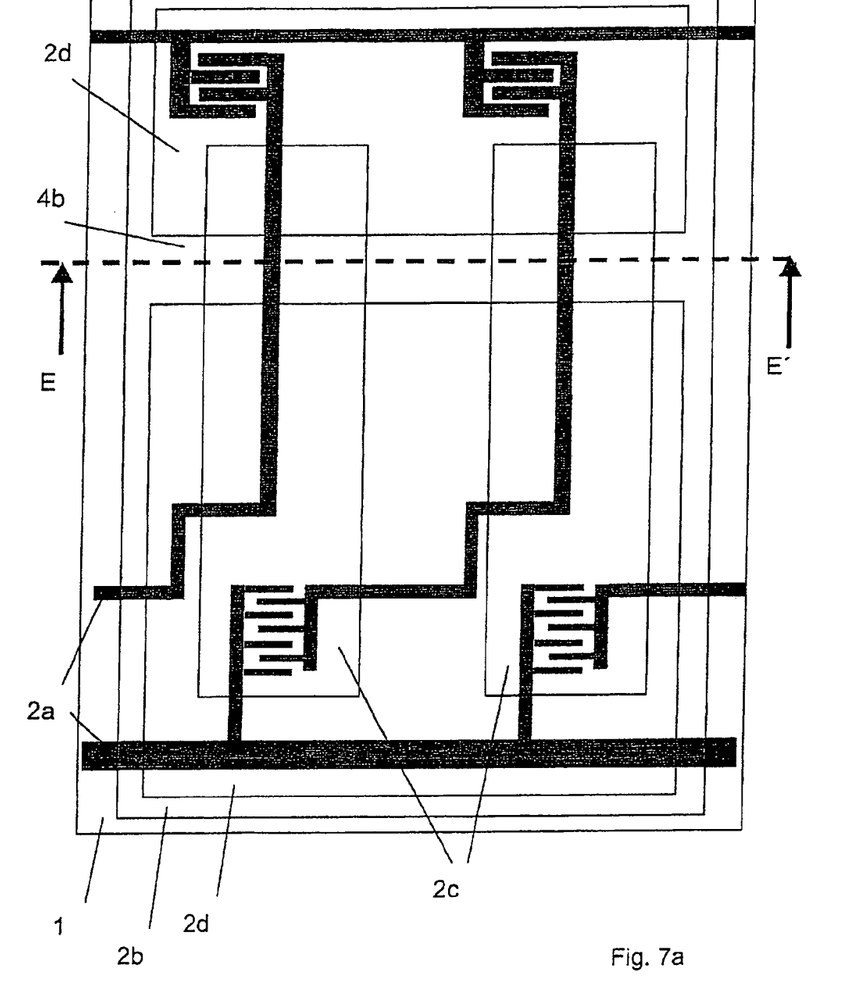

FIG. 7a shows an excerpt from an electrical circuit, here a ring oscillator circuit, in plan view. Situated on a substrate 1 are electrically conductive functional layers 2a covered by a thin organic, semiconducting functional layer 2b applied over the whole area. Situated on the organic, semiconducting functional layer 2b is an electrically insulating functional layer 2d applied over the whole area in strip-type fashion, the electrically insulating functional layer having an opening 4b in the region in which the section E-E' is placed, which opening was subsequently formed by means of a laser. Situated on the electrically insulating layer 2d is a further electrically conductive layer 2c, shown in phantom with dashed lines to illustrate its relative position, which is formed in strip-type fashion. In the region of the opening in the electrically insulating layer 2d, the electrically conductive layer 2c is in each case in contact with the electrically conductive functional layer 2a since the semiconducting layer 2b is made so thin that an electrical contact or a short circuit between the conductive layers 2a and 2c is formed in the region of said opening. In the region of the circuit in which the electrically conductive layer 2a, the semiconducting layer 2b, the electrically insulating layer 2d and the electrically conductive layer 2c are arranged one above another and additionally in the region of the comb structures within the electrically conductive layer 2a, an organic field effect transistor is formed in each case.

Figure 7B:
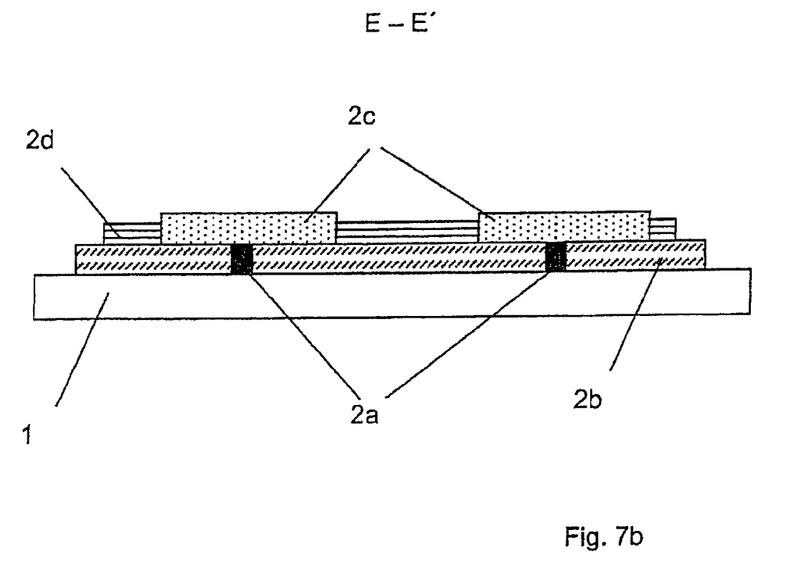

The section through the substrate 1 and the layers arranged thereon in the region E-E' is illustrated in FIG. 7b. This illustrates the layer construction for the region in which the opening in the electrically insulating layer 2d is situated.

The illustrations in FIGS. 1a to 7b serve only for illustrating the concept of the invention. On this basis the person skilled in the art is readily able to find further electronic circuits and exemplary applications for which layers applied in strip-type fashion on a substrate can be used, without departing here from the invention. Thus, FIGS. 1a to 7b are not intended to result in any limitation whatsoever to a specific arrangement of strip-type layers, components and the number and interconnection thereof.

The invention claimed is:

1. An electronic circuit comprising:
   at least two electronic components on a common flexible substrate, wherein the at least two electronic components each include at least one shared common electrical functional layer composed of identical functional layer material comprising at least one of an organic semiconducting layer and an insulating layer;
   wherein the electrical functional layers composed of identical functional layer material each comprise regions of an elongated strip layer on the substrate;
   wherein at least two of the layers are parallel, each comprising an elongated strip composed of identical or different functional layer materials for providing electrical functional layers of the at least two electronic components;
   wherein at least one first electronic component of the at least two electronic components is one of a transistor, a diode, a nonreactive resistor or a capacitor and at least one further electronic component of the at least two electronic components is different in at least one of kind, properties or configuration than the at least one first component with respect to the group comprising a transistor, a diode, a nonreactive resistor and a capacitor; and
   wherein at least two identical components are included formed jointly with at least one of the elongated strip layers.

2. The electronic circuit as claimed in claim 1 wherein a first electronic component of the at least two electronic components has a first electrical functional layer, and in that a second electronic component of the at least two electronic components has a second electrical functional layer, wherein the first and the second electrical functional layers are of identical functional layer material, wherein the first and the second electrical functional layers are arranged on the substrate aligned in-line or side by side.

3. The electronic circuit as claimed in claim 1 wherein the layers in the form of elongated strips on the substrate comprise a semiconducting layer and an electrically insulating layer.

4. The electronic circuit as claimed in claim 1 wherein the layers in the form of elongated strips on the substrate are printed on the substrate.

5. The electronic circuit as claimed in claim 1 wherein at least one of the elongated strip layers on the substrate includes one or both of interrupted and subdivided mutually independent layer regions, wherein, as seen over a cross section of the elongated strip layers on the substrate, the elongated strip layers have at least one continuous opening therebetween.

6. The electronic circuit as claimed in claim 5 wherein at least one of the layers in the form of elongated strips on the substrate has a longitudinal direction and is subdivided in either or both of the longitudinal direction and perpendicular to the longitudinal direction.

7. The electronic circuit as claimed in claim 5 wherein the at least one opening in the at least one of the layers in the form of elongated strips on the substrate has a via wherein through the via an electrical contact is included between electrical functional layers arranged, as seen perpendicular to the substrate plane, above and below the at least one of the layers in the form of elongated strips.

8. The electronic circuit as claimed in claim 5 wherein the opening has a width within the range of 1 μm to 10 mm.

9. The electronic circuit as claimed in claim 1 wherein one of the components comprises a field effect transistor.

10. The electronic circuit as claimed in claim 9 wherein at least two electronic components of the electronic circuit are field effect transistors each comprising a semiconducting electrical functional layer composed of identical functional layer material, provided by layer regions of a semiconducting layer in the form of elongated strips on the substrate, and wherein the field effect transistors each comprise an electrically insulating electrical functional layer composed of identical functional layer material, which layer regions of an electrically insulating layer comprise respective elongated strips on the substrate.

11. The electronic circuit as claimed in claim 1 wherein at least two electronic components of the electronic circuit are diodes, each of which diodes comprises a semi-conducting electrical functional layer composed of identical functional layer material, which are layer regions of a semiconducting layer in the form of an elongated strip on the substrate.

12. The electronic circuit as claimed in claim 1 wherein at least two electronic components are each nonreactive resistors, wherein the resistors each comprise a functional layer composed of identical functional layer material, which comprise layer regions of a layer in the form of an elongated strip on the substrate.

13. The electronic circuit as claimed in claim 1 wherein at least two electronic components of the electronic circuit are each capacitors, each comprising an electrically insulating functional layer composed of identical functional layer material comprising layer regions of an electrically insulating layer in the form of elongated strip on the substrate.

14. The electronic circuit as claimed in claim 1 wherein the flexible substrate is an elongated tape.

15. The electronic circuit as claimed in claim 14, wherein the layers in the form of elongated strips on the substrate are parallel to a longitudinal side of the tape.

16. The electronic circuit as claimed in claim 1 wherein the flexible substrate is multilayered.

17. The electronic circuit as claimed in claim 1 wherein two to twenty layers in the form of elongated strips are on the substrate.

18. The electronic circuit as claimed in claim 1 wherein the at least two layers in the form of elongated strips on the substrate, as seen in the substrate cross section, are in one plane or in different planes on the substrate.

19. The electronic circuit as claimed in claim 1 wherein at least two electronic components each comprise at least two electrical functional layers composed of different functional layer materials, wherein each one of the at least two electrical functional layers of the at least two components comprises a layer region in the form of an elongated strip layer that is used jointly by the at least two electronic components.

20. The electronic circuit as claimed in claim 1 wherein the layers in the form of elongated strips on the substrate have a layer thickness within the range of 1 nm to 300 µm.

21. The electronic circuit as claimed in claim 1 wherein the at least two electronic components further comprise electrically conductive functional layers.

22. The electronic circuit as claimed in claim 1 wherein the electronic circuit is an organic circuit.

23. The electronic circuit as claimed in claim 1 wherein the electronic circuit comprises components having one of or both of only organic electrical functional layers, or organic and inorganic electrical functional layers.

24. A method for the manufacture of an electronic circuit comprising;
    forming at least two electronic components on a common flexible substrate, wherein the at least two electronic components each are formed with at least one electrical functional layer composed of identical functional layer material comprising at least one of a shared common semiconductor layer and insulating layer;
    wherein the forming step includes forming at least two layers as elongated strip layers on the substrate at least one of which of said at least two layers is said at least one of a shared common semiconductor and insulating layer;
    the forming step including forming the electrical functional layers composed of identical functional layer material from layer regions of an individual one of elongated strip layers;
    wherein the forming step includes forming at least two parallel elongated strip layers of elongated strips composed of identical or different functional layer materials to provide a electrical functional layers of the components on the substrate;
    wherein the forming step includes forming at least one first electronic component of the electronic circuit as a transistor, a diode, a nonreactive resistor or a capacitor and forming at least one further electronic component of the electrical circuit as a different component in at least one of kind, properties or configuration with respect thereto from the group comprising a transistor, a diode, a nonreactive resistor and a capacitor; and
    wherein the forming step includes forming at least two identical components comprising at least one of the elongated strip layers.

25. The method as claimed in claim 24 including forming the at least two layers in the form of elongated strips in a continuous process on the substrate in a predetermined application direction.

26. The method as claimed in claim 25 wherein a first electronic component of the at least two electronic components has a first electrical functional layer, and wherein a second electronic component of the at least two electronic components has a second electrical functional layer, wherein the method includes forming the first and the second electrical functional layers from identical functional layer material, and arranging the first and the second electrical functional layers on the substrate aligned in a line or side by side in the application direction.

27. The method as claimed in claim 24 including forming the flexible substrate into an elongated tape and transporting the substrate from roll to roll during the formation of the at least two elongated strip layers.

28. The method as claimed in claim 25 including forming the flexible substrate into an elongated tape wherein the application direction is parallel to a longitudinal side of the tape.

29. The method as claimed in claim 25 wherein the continuous process comprises printing the elongated strip shape layer from the group comprising intaglio printing, relief printing, screen printing, or in that the continuous process used is another coating method that applies a liquid medium to the substrate for forming at least one of the elongated strip layers.

30. The method as claimed in claim 27 employing a printing medium or liquid medium having a dynamic viscosity of less than 200 mPas at a temperature of 20° C. for forming at least one of the elongated strip layers.

31. The method as claimed in claim 24 wherein at least one of the elongated strip layers is structured by one of a laser beam, embossing, cutting, grinding or scratching.

32. The method as claimed in claim 24 including forming the at least two electronic components with further electrical functional layers by one of printing, vapor deposition or sputtering.

33. The electric circuit as claimed in claim 21 wherein the electrically conductive functional layers are organic material.

34. The electronic circuit of claim 1 wherein the at least two elongated strip layers are continuous, at least one first electronic component and the at least one further electronic component are on respective different elongated continuous strip functional layer materials.

35. The method of claim 24 including forming the at least two elongated strip layers as continuous layers, and further forming the at least one first electronic component and the at least one further electronic component on respective different elongated continuous strip functional layer materials.

36. The electronic circuit of claim 1 wherein the at least two elongated strip layers have different thicknesses, the at least one first electronic component and the at least one further electronic component are on respective ones of the different elongated continuous strip functional layers of different thicknesses.

37. The method of claim 24 including forming the at least two elongated strip layers with different thicknesses, and further forming the at least one first electronic component and the at least one further electronic component on respective different elongated continuous strip functional layers of different thicknesses.

* * * * *